United States Patent
Iizuka

(10) Patent No.: US 9,807,862 B2
(45) Date of Patent: Oct. 31, 2017

(54) PLASMA PROCESSING APPARATUS

(71) Applicant: TOKYO ELECTRON LIMITED, Tokyo (JP)

(72) Inventor: Hachishiro Iizuka, Yamanashi (JP)

(73) Assignee: TOKOYO ELECTRON LIMITED, Tokyo (JP)

( * ) Notice: Subject to any disclaimer, the term of this patent is extended or adjusted under 35 U.S.C. 154(b) by 433 days.

(21) Appl. No.: 13/794,954

(22) Filed: Mar. 12, 2013

(65) Prior Publication Data

US 2013/0264014 A1 Oct. 10, 2013

Related U.S. Application Data

(60) Provisional application No. 61/613,529, filed on Mar. 21, 2012.

(30) Foreign Application Priority Data

Mar. 12, 2012 (JP) .................................. 2012-054484

(51) Int. Cl.
*H01J 37/32* (2006.01)
*H05H 1/46* (2006.01)

(52) U.S. Cl.
CPC ............. *H05H 1/46* (2013.01); *H01J 37/321* (2013.01); *H01J 37/3211* (2013.01); *H01J 37/32119* (2013.01); *H05H 2001/4667* (2013.01)

(58) Field of Classification Search
CPC ............. H05H 1/46; H05H 2001/4667; H01J 37/32119; H01J 37/3211; H01J 37/321
See application file for complete search history.

(56) References Cited

U.S. PATENT DOCUMENTS

| | | | | |
|---|---|---|---|---|
| 6,136,140 A | * | 10/2000 | Ishii et al. | 156/345.48 |
| 6,331,754 B1 | * | 12/2001 | Satoyoshi | H01J 37/321 |
| | | | | 118/723 I |
| 6,530,342 B1 | * | 3/2003 | Johnson | 118/723 I |
| 6,586,886 B1 | * | 7/2003 | Katz et al. | 315/111.21 |
| 2003/0159782 A1 | * | 8/2003 | Brcka | 156/345.48 |
| 2004/0149699 A1 | * | 8/2004 | Hofman et al. | 219/121.43 |
| 2005/0173569 A1 | * | 8/2005 | Noorbakhsh et al. | 239/690 |

FOREIGN PATENT DOCUMENTS

| | | | | | |
|---|---|---|---|---|---|
| JP | 10255997 | A | * | 9/1998 | |
| JP | 10294307 | A | * | 11/1998 | |
| JP | 3192352 | B2 | | 5/2001 | |
| JP | 2005285564 | A | * | 10/2005 | |
| JP | 2008159660 | A | * | 7/2008 | |
| JP | 4193255 | B2 | | 10/2008 | |
| JP | WO 2008153052 | A1 | * | 12/2008 | H01J 37/32192 |

* cited by examiner

*Primary Examiner* — Yuechuan Yu
(74) *Attorney, Agent, or Firm* — Rothwell, Figg, Ernst & Manbeck, P.C.

(57) ABSTRACT

A plasma processing apparatus includes an ICP antenna, provided outside a processing chamber opposite to a mounting table, for supplying a high frequency power supply into the processing chamber, and a window member made of a conductor, disposed between the mounting table and the ICP antenna, forming a part of a wall of the processing chamber. The window member includes transmission units for transmitting the high frequency power in a thickness direction of the window member. Each of transmission units has a slit, which extends through the window member in the thickness direction and is configured such that its width is changeable.

13 Claims, 9 Drawing Sheets

PLASMA PROCESSING APPARATUS

CROSS-REFERENCE TO RELATED APPLICATIONS

This application claims priority to Japanese Patent Application No. 2012-054484 filed on Mar. 12, 2012 and U.S. Provisional Application No. 61/613,529 filed on Mar. 21, 2012, the entire contents of which are incorporated herein by reference.

FIELD OF THE INVENTION

The present invention relates to a plasma processing apparatus for generating a plasma by introducing a high frequency current or a microwave into a processing chamber.

BACKGROUND OF THE INVENTION

In a plasma processing apparatus having an ICP (inductive coupling plasma) antenna installed outside a chamber, since a high frequency power from the ICP antenna connected to a high frequency power supply cannot be transmitted through a conductor, a ceiling portion of the chamber which is opposite to the ICP antenna is formed as a dielectric window made of, e.g., quartz; and the high frequency power applied to the ICP antenna is supplied into the chamber through the dielectric window. The high frequency power supplied into the chamber excites a processing gas, so that a plasma is generated.

The dielectric window needs to have a thickness that ensures enough stiffness to endure pressure differences between a depressurized environment inside the chamber and an atmospheric pressure environment outside the chamber. Further, along with the trend toward scaling up of a semiconductor wafer, the dielectric window opposite to the semiconductor wafer also needs to be scaled up. Further, the dielectric window needs to have enough stiffness to manage the scaling up of the semiconductor wafer, and thus requires a thicker thickness.

However, as the dielectric window becomes thicker, the high frequency power transmitted therethrough is decreased, which results in a decrease of plasma generation efficiency. Moreover, due to the high-cost of quartz forming the dielectric window, the cost of the plasma processing apparatus rises as the dielectric window becomes thicker.

Accordingly, there has been proposed a plasma processing apparatus 114 in which a ceiling portion 111 of a chamber 115 which is opposite to an ICP antenna 110 is made of a relatively inexpensive conductor having high stiffness, e.g., a plate-shaped member made of aluminum; a plurality of slits 112 are provided to extend through the ceiling portion 111 and respectively covered by dielectric windows 113; and a part of the ICP antenna 110 is made to face the inside of the chamber 115 through the dielectric windows 113, as shown in FIG. 11 (see, e.g., Patent Document 1).

In the plasma processing apparatus 114, the size of each of the dielectric windows 113 can be reduced since the respective dielectric windows 113 are provided to cover the slits 112 only. Accordingly, it is unnecessary to increase the thickness of the dielectric window 113 in order to ensure stiffness.

Further, there has been proposed a plasma processing apparatus using both parallel plate electrodes and an ICP antenna (see, e.g., Patent Document 2). Specifically, as shown in FIG. 12, a plasma processing apparatus 120 includes parallel plate electrodes having a mounting table 121 serving as a lower electrode and a shower head 122 serving as an upper electrode; and a dielectric window 123 that is a ring-shaped dielectric member arranged so as to surround the shower head 122. At the central portion of the chamber 124, a plasma of a processing gas is generated by a high frequency power applied from the parallel plate electrodes. At a peripheral portion of the chamber 124, the plasma of the processing gas is generated by a high frequency power applied from the ICP antenna 125 through the dielectric window 123. Accordingly, with this plasma processing apparatus 120, the size of the dielectric window 123 can be reduced since the ceiling portion of the chamber 124 does not need to be entirely formed with the dielectric window 123. As a result, it is unnecessary to increase the thickness of the dielectric window 123 in order to ensure stiffness.

Patent Document 1: Japanese Patent No. 4193255
Patent Document 2: Japanese Patent No. 3192352

In the plasma processing apparatus 114 described in Patent Document 1, however, the high frequency power passes through the slits 112 only, so that the plasma density at the regions that correspond to the slits 112 in the chamber 115 is only increased. This leads to a non-uniform distribution of the plasma density. Further, the positions and the sizes of the slits 112 cannot be changed since the slits 112 are formed by making holes in the thickness direction in a plurality of portions of the ceiling portion 111. Therefore, the control of the plasma density distribution in the chamber 115 is limited.

Further, in the plasma processing apparatus 120 described in Patent Document 2, the position and the size of the perimeter of the annular coils of the ICP antenna 125 cannot be changed. Hence, the control of the plasma density districution in the chamber 124 is limited.

SUMMARY OF THE INVENTION

In view of the above, the present invention provides a plasma processing apparatus capable of arbitrarily controlling a plasma density distribution in a processing chamber and suppressing an increase in cost.

In accordance with an embodiment of the present invention, there is provided a plasma processing apparatus including: a processing chamber configured to accommodate a substrate; a mounting table provided in the processing chamber and configured to mount thereon the substrate; an applied antenna provided outside the processing chamber opposite to the mounting table and configured to supply a high frequency power or a microwave into the processing chamber; and a window member made of a conductor, which forms a part of a wall of the processing chamber and is disposed between the mounting table and the applied antenna. Further, the window member includes transmission units configured to transmit the high frequency power or the microwave in a thickness direction of the window member, and each of the transmission units includes a slit extending through the window member in the thickness direction, and a width adjustment mechanism for adjusting a width of the slit.

Further, the applied antenna may have a ring-shaped coil connected to a high frequency power supply, and the transmission units may be disposed along the ring-shaped coil.

Further, the width adjustment mechanism may include a through hole extending through the window member in the thickness direction and an insertion member made of a conductor, which is inserted into the through hole. Further, the slit may be formed as a gap between the through hole and the insertion member inserted into the through hole and the width of the slit may be adjusted by changing the size of the insertion member.

Further, a sealing member may be provided in the slit.

Further, the through hole may be a cylindrical hole. The insertion member may be a cylindrical member. The sealing member may be an O-ring. A ring-shaped member made of a dielectric material may be provided in the slit between the O-ring and the inside of the processing chamber.

The plasma processing apparatus described above may further include a covering plate-shaped member covering a surface of the window member which faces the inside of the processing chamber.

Further, a high frequency power supply may be connected to the mounting table, and the covering plate-shaped member may serve as an electrode plate made of a conductor or a semiconductor. The mounting table and the electrode plate may constitute parallel plate electrodes.

Further, the covering plate-shaped member may have a plurality of different slits extending therethrough in a thickness direction of the covering plate-shaped member.

Further, positions of slits of the transmission units formed in the window member may be arranged not to be aligned with positions of the different slits formed in the covering plate-shaped member.

In accordance with the present invention, the window member is made of the conductor, each of the transmission units for transmitting the high frequency power or the microwave in the thickness direction of the window member includes the slit extending through the window member in the thickness direction, and the width adjustment mechanism for adjusting the width of the slit. Since the conductor is relatively inexpensive, the increase in the cost of the window member, and further, the increase in the cost of the plasma processing apparatus can be suppressed. The level of the high frequency power or the intensity of the microwave supplied into the processing chamber through each slit can be changed by adjusting the width of the slit with the width adjustment mechanism. Therefore, it is possible to control the plasma density at the regions corresponding to the slits in the processing chamber. As a result, the distribution of plasma density in the processing chamber can be arbitrarily controlled.

BRIEF DESCRIPTION OF THE DRAWINGS

FIGS. 1A and 1B schematically show a configuration of a plasma processing apparatus in accordance with a first embodiment of the present invention, wherein FIG. 1A is a cross sectional view of the plasma processing apparatus and FIG. 1B is a perspective view showing an arrangement of coils of an ICP antenna shown in FIG. 1A.

FIGS. 4A and 4B explain how the plasma processing apparatus shown in FIGS. 1A and 1B controls the plasma density distribution, wherein FIG. 4A is a bottom view showing a positional relationship between the transmission units and the annular induction coils, and FIG. 4B is a graph showing the plasma density distribution before and after the adjustment of the widths of the slits.

FIGS. 9A and 9B schematically show a configuration of a modification of the plasma processing apparatus shown in FIG. 7, wherein FIG. 9A is a cross sectional view of the plasma processing apparatus, and FIG. 9B is a perspective view showing an arrangement of coils of an ICP antenna shown in FIG. 9A.

DETAILED DESCRIPTION OF THE EMBODIMENTS

Hereinafter, embodiments of the present invention will be described with reference to the accompanying drawings.

First, a plasma processing apparatus in accordance with a first embodiment of the present invention will be described.

Figure 1A:
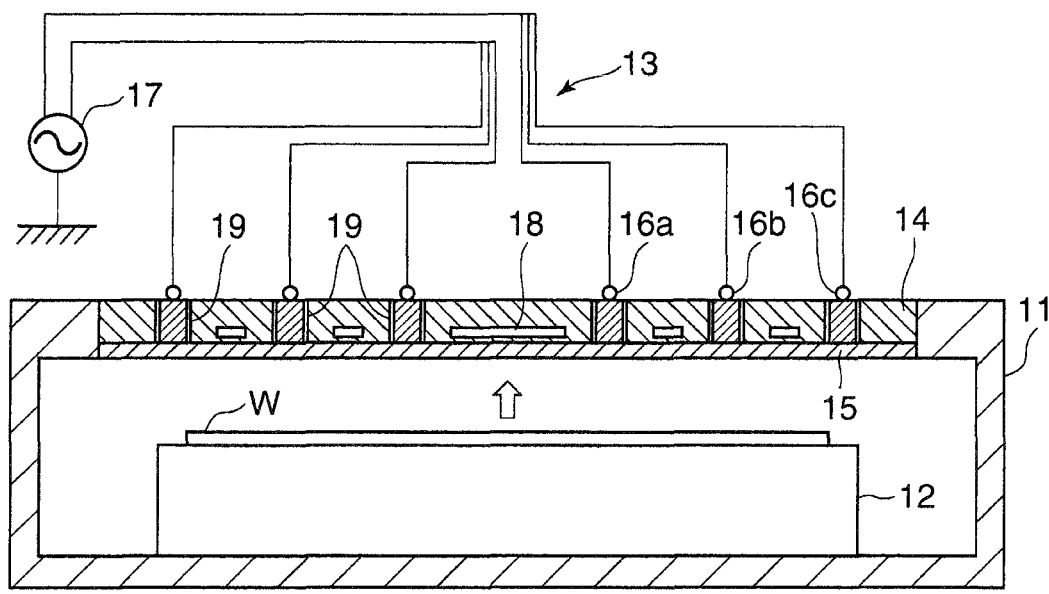
Figure 1B:
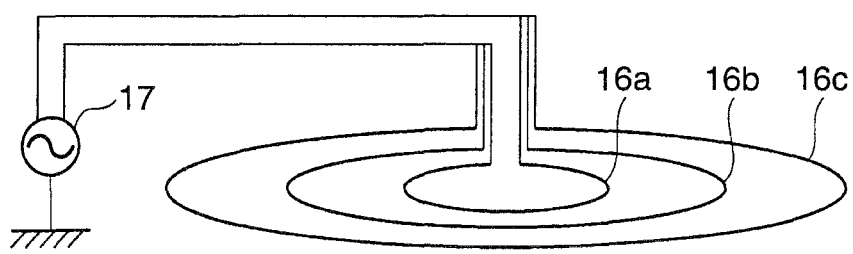

FIGS. 1A and 1B schematically show a configuration of a plasma processing apparatus in accordance with a first embodiment of the present invention, wherein FIG. 1A is a cross sectional view of the plasma processing apparatus and FIG. 1B is a perspective view showing an arrangement of coils of an ICP antenna shown in FIG. 1A.

Referring to FIG. 1A, a plasma processing apparatus 10 includes a substantially cylindrical chamber 11 (processing chamber) for accommodating a semiconductor wafer (hereinafter, simply referred to as "wafer") W as a substrate; a substantially columnar mounting table 12, provided at a bottom portion of the chamber 11, for mounting thereon the wafer W; an ICP antenna 13 (applied antenna) disposed outside the chamber 11 opposite to the mounting table 12 in the chamber 11; a window member 14 forming a ceiling portion of the chamber 11, disposed between the mounting table 12 and the ICP antenna 13; and a cover plate 15 (covering plate-shaped member) for covering a surface of the window member 14 which faces the inside of the chamber 11 (hereinafter, referred to as "bottom surface").

The inside of the chamber 11 is under a depressurized environment, and the outside of the chamber 11 is under an atmospheric pressure environment. The inside and the outside of the chamber 11 are partitioned by the window member 14. The window member 14 and the cover plate 15 are formed of a circular plate-shaped member. Particularly, the window member 14 is made of a conductor, e.g., a metal such as aluminum or the like. Each of the window member 14 and the cover plate 15 has the size that can cover at least the entire surface of the wafer W mounted on the mounting table 12. Further, a processing gas diffusion space 18 to be described later is formed inside the window member 14. A processing gas, which is supplied from a processing gas supply unit (not shown) provided outside the chamber 11 into the processing gas diffusion space 18, is diffused in the processing gas diffusion space 18 and then supplied into the chamber 11.

The ICP antenna 13 has three annular induction coils 16a to 16c arranged substantially concentrically and a high frequency power supply 17 connected to each of the annular induction coils 16a to 16c, as shown in FIG. 1B. Each of the annular induction coils 16a to 16c is disposed on the window member 14 such that the plane including all the annular induction coils 16a to 16c is parallel with the cover plate 15 and the wafer W mounted on the mounting table 12.

In the plasma processing apparatus 10, a high frequency power is supplied from each of the annular induction coils 16a to 16c into the chamber 11. The high frequency powers pass through in the thickness direction of the window member 14, reach the inside of the chamber 11, and then excite the processing gas. Accordingly, a plasma is generated, and a desired plasma process, e.g., a dry etching process, is performed on the wafer W by the plasma thus generated.

As described above, since the window member 14 is made of a metal such as aluminum or the like, it can be manufactured at a low cost. However, the high frequency powers from the annular induction coils 16a to 16c cannot be transmitted through such a window member 14. Therefore, in the present embodiment, the window member 14 has a plurality of transmission units 19 through which the high frequency power is transmitted in the thickness direction of the window member 14.

Figure 2:
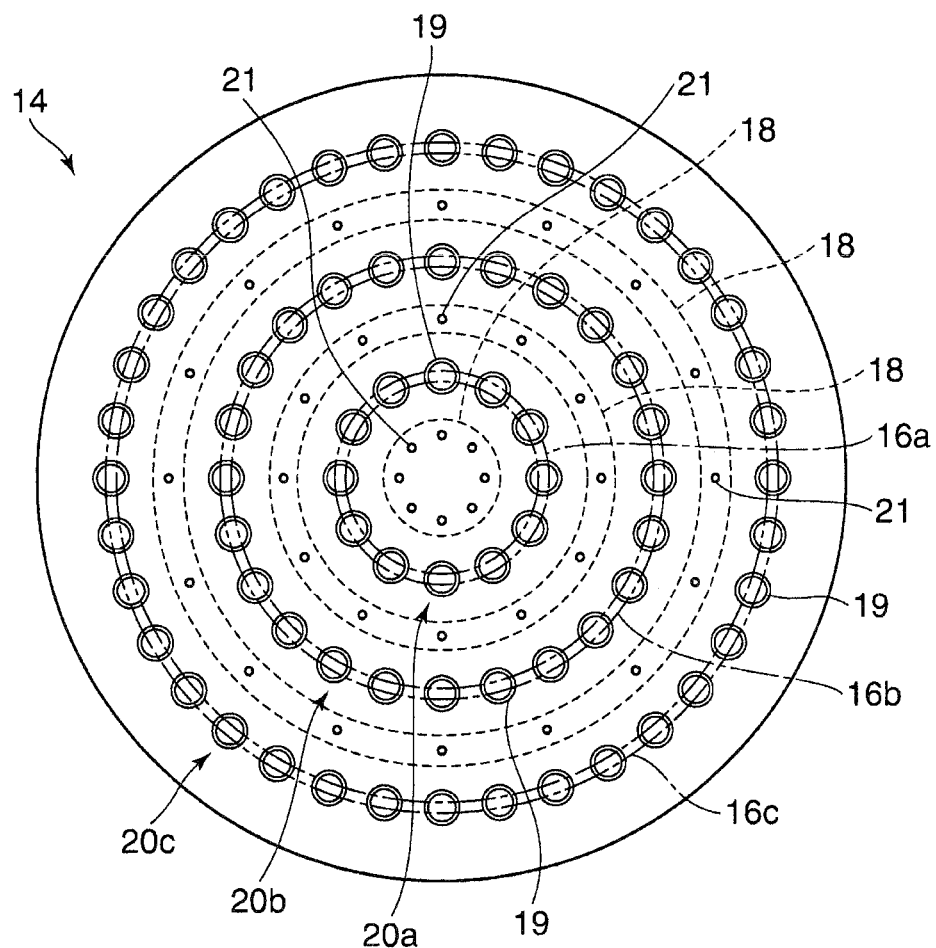
FIG. 2 is a bottom view showing a window member shown in FIGS. 1A and 1B when viewed in a direction of an arrow in FIG. 1A.

FIG. 2 is a bottom view showing the window member shown in FIGS. 1A and 1B when viewed in a direction of an arrow in FIG. 1A.

In FIG. 2, the annular induction coils 16a to 16c are indicated by dashed dotted lines, and the processing gas diffusion space 18 is indicated by dashed lines.

Referring to FIG. 2, the window member 14 has a plurality of transmission units 19 arranged in three concentric circular patterns.

On a circumference basis, the transmission units 19 can be divided into an inner transmission unit group 20a, an intermediate transmission unit group 20b and an outer transmission unit group 20c. The transmission units 19 in the inner transmission unit group 20a are arranged along the annular induction coil 16a. The transmission units 19 in the intermediate transmission unit group 20b are arranged along the annular induction coil 16b. The transmission units 19 in the outer transmission unit group 20c are arranged along the annular induction coil 16c. The transition units 19 may be provided in three or more concentric circular patterns.

A circular plate-shaped processing gas diffusion space 18 is formed at an inner side of the inner transmission unit group 20a. A ring-shaped processing gas diffusion space 18 is formed between the inner transmission unit group 20a and the intermediate transmission unit group 20b, and between the intermediate transmission unit group 20b and the outer transmission unit group 20c. The processing gas diffusion spaces 18 are formed in concentric circular patterns along with the inner transmission unit group 20a, the intermediate transmission unit group 20b, and the outer transmission unit group 20c. Formed on a bottom surface of the window member 14 is a plurality of processing gas supply holes 21 communicating with the inside of the processing gas diffusion spaces 18 and the inside of the chamber 11. The processing gas supply holes 21 are circumferentially arranged at regular intervals. Accordingly, the processing gas is uniformly supplied from the processing gas diffusion spaces 18 into the chamber 11.

Figure 3:
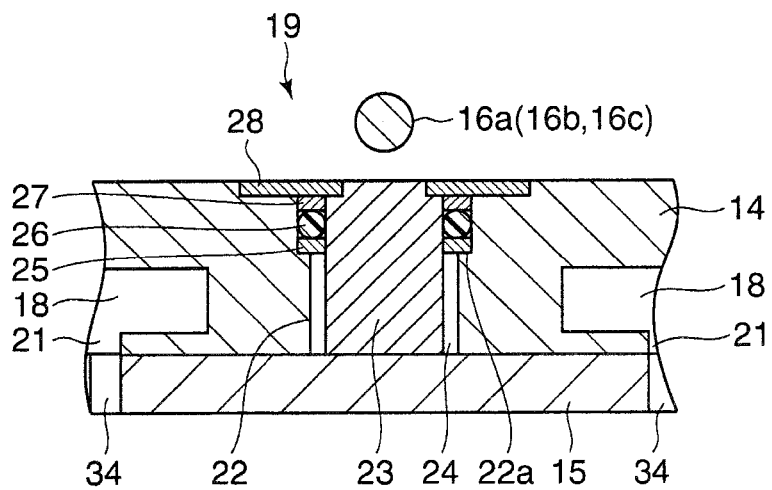
FIG. 3 is an enlarged cross sectional view schematically showing a transmission unit shown in FIG. 2.

FIG. 3 is an enlarged cross sectional view schematically showing the transmission unit 19 of FIG. 2.

Referring to FIG. 3, the transmission unit 19 includes a cylindrical through hole 22 formed through the window member 14 in the thickness direction, and a cylindrical insertion member 23 inserted into the through hole 22. A diameter of the insertion member 23 is set to be smaller than that of the through hole 22, so that a slit 24 that is an annular gap extending through the window member 14 in the thickness direction is formed between the insertion member 23 and the through hole 22. By adjusting the annular gap to have a predetermined width, the plasma can be uniformly generated in the processing chamber. In the present embodiment, the width of the slit 24 is adjusted by changing the diameter of the insertion member 23, particularly by replacing the insertion member 23 in the through hole 22 with one having a different diameter. The through hole 22 and the insertion member 23 may serve as a width adjustment mechanism.

The through hole 22 has an upper portion with an increased diameter which extends toward a surface opposite to the bottom surface of the window member 14 (hereinafter, referred to as "top surface"), so that a stepped portion 22a is formed. A lower dielectric ring 25 (ring-shaped dielectric member) is mounted on the stepped portion 22a. An O-ring 26 (sealing member) is mounted on the lower dielectric ring 25. An upper dielectric ring 27 (ring-shaped dielectric member) is mounted on the O-ring 26. The O-ring 26 is made of, e.g., a heat-resistant rubber and adhered so as to surround the side surface of the insertion member 23. When the insertion member 23 is inserted into the through hole 22, the O-ring 26 is uniformly brought into contact with the inner wall surface of the through hole 22. Accordingly, the insertion member 23 is positioned concentrically with the through hole 22 to thereby obtain the uniform width of the slit 24.

A plate-shaped flange (annular ring member) 28 is provided on the top surface of the window member 14 so as to correspond to each transmission unit 19. The flange 28 is made of a dielectric material, e.g., resin, ceramic such as aluminum having an alumite-treated surface, alumina, aluminum nitride or the like. Each flange 28 is fixed by compressing the O-ring 26 via the upper dielectric ring 27. For example, the flange 28 is fixed by, e.g., screws or the like. The compressed O-ring 26 is deformed and adhered to the inner wall surface of the through hole 22 and to the side surface of the insertion member 23. Therefore, communication between the inside of the chamber 11 and the outside of the chamber 11 via the slits 24 is prevented. Accordingly, the depressurized state in the chamber 11 can be airtightly maintained. The flange 28 presses the insertion member 23 toward the cover plate 15, so that the insertion member 23 is brought into contact with the cover plate 15, thus securing the position thereof. As a consequence, the width of each slit 24 becomes uniform.

In the transmission unit 19, the insertion member 23 is made of a conductor, e.g., a metal such as aluminum, nickel, copper, alloy or the like. Thus, the high frequency power applied from the annular induction coil 16a (16b, 16c) passes through each slit 24 in the thickness direction of the window member 14 via the flange 28, the upper dielectric ring 27, the O-ring 26 and the lower electric ring 25 without passing through the insertion member 23.

Although the upper dielectric ring 27, the O-ring 26 and the lower dielectric ring 25 are provided in each slit 24, the thicknesses thereof are extremely small compared to that of the window member 14 and, thus, the high frequency power is hardly attenuated while passing through the upper dielectric ring 27, the O-ring 26 and the lower dielectric ring 25. Therefore, the transmission units 19 can effectively supply the high frequency power into the chamber 11 through the slits 24.

In the window member 14, each of the transmission units 19 is separated from the processing gas diffusion space 18, so that the high frequency power passing through the slits 24 and the processing gas supplied from the processing gas diffusion space 18 through the processing gas supply holes 21 make contact with each other inside of the chamber 11. Accordingly, since the processing gas is not excited in the processing gas diffusion space 18, the inner surface of the processing gas diffusion space 18 is not damaged by the plasma of the excited processing gas.

The level of the high frequency power passing through the slits 24 is varied depending on the widths of the slits 24. Specifically, when the widths of the slits 24 are increased, the level of the high frequency power supplied into the chamber 11 through the slits 24 is increased. When the level of the supplied high frequency power is increased, the excitation of the processing gas is facilitated and a larger amount of plasma is generated. This results in the increase of the plasma density. In the present embodiment, the level of the high frequency power supplied into the chamber 11 through the slits 24 is changed by adjusting the widths of the slits 24. Accordingly, it becomes possible to control the plasma density at the regions corresponding to the transmission units 19 in the chamber 11. As a result, the distribution of the plasma density in the chamber 11 can be arbitrarily controlled.

Figure 4A:
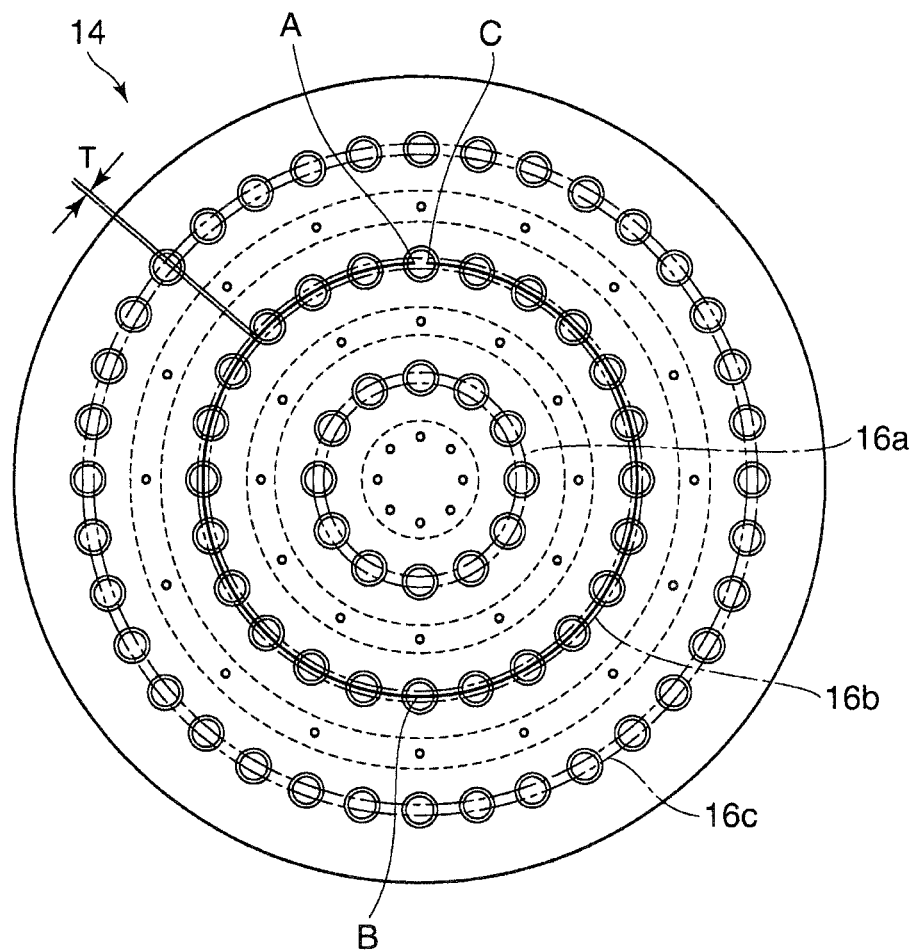
Figure 4B:
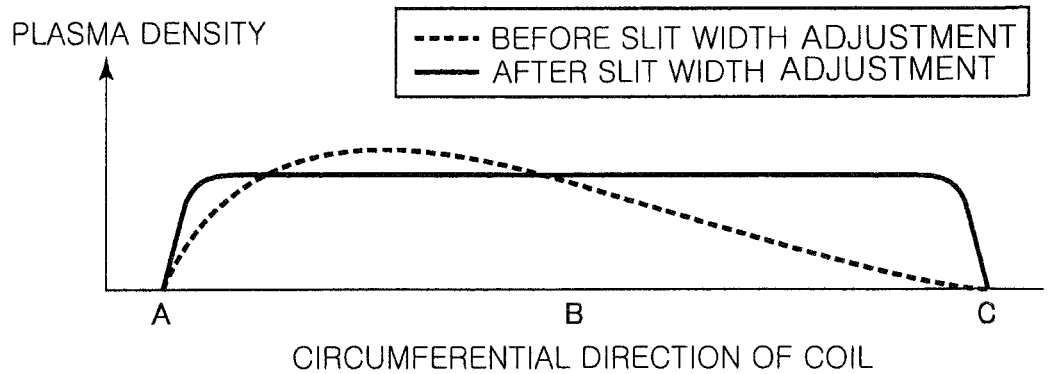

In general, when the high frequency power is applied to each of the annular induction coils 16a to 16c of the ICP antenna 13, the high frequency power is not uniformly applied along the circumferential direction of each coil. Therefore, the level of the applied high frequency power becomes non-uniform along the circumferential direction. For example, although the density of the plasma generated by the high frequency power applied from the annular induction coil 16b is distributed along the circumferential direction ABC (see FIG. 4A), the plasma density distribution may become non-uniform as indicated by a dotted line shown in FIG. 4B.

In the present embodiment, among the transmission units 19 of the intermediate transmission unit group 20b, the width of the slit 24 of the transmission unit 19 corresponding to the region where the plasma density is high is made to be decreased, and the width of the slit 24 of the transmission unit 19 corresponding to the region where the plasma density portion is low is made to be increased. Accordingly, the plasma density at the region where the plasma density is high can be decreased by decreasing the level of the high frequency power supplied thereto, and the plasma density at the region where the plasma density is low can be increased by increasing the level of the high frequency power supplied thereto. As a result, the non-uniformity of the plasma density distribution can be solved, as indicated by a solid line in FIG. 4B.

In other words, by adjusting the widths of the slits 24 of the transmission units 19 arranged in the circumferential direction of each of the annular induction coils 16a to 16c, the level of the high frequency power applied from each of the annular induction coils 16a to 16c can be changed in accordance with the circumferential direction. Accordingly, the density distribution of the plasma generated by each of the annular induction coils 16a to 16c in the chamber 11 can be properly controlled.

Further, with respect to the respective circumferential lengths of the annular induction coils 16a to 16c, it is possible to adjust the summation of widths T (see FIG. 4A) of the slits 24 in each of the inner transmission unit group 20a, the intermediate transmission group 20b and the outer transmission unit group 20c such that the integrated value of the high frequency power supplied into the chamber 11 is increased as the summation of the widths T of the slits is increased, and the integrated value of the high frequency power supplied into the chamber 11 is decreased as the summation of the widths T of the slits is decreased.

From the results of the tests, the present inventors have found that when the summation of the widths T of the slits 24 in the inner transmission unit group 20a is about 25% or above of the circumferential length of the annular induction coil 16a, the supply efficiency of the high frequency power from the annular induction coil 16a into the chamber 11 is about 70% or higher. Further, the present inventors have found that when the summation of the widths T of the slits 24 is about 34% or above of the circumferential length of the annular induction coil 16a, the supply efficiency of the high frequency power is further improved to about 90% or higher. The supply efficiency of the high frequency power into the chamber 11 is sufficiently high when it is equal to or higher than about 70%. Therefore, the summation of the widths T of the slits 24 in each of the inner transmission unit group 20a, the intermediate transmission unit group 20b, and the outer transmission unit group 20c is preferably set to be about 25% or above with respect to the circumferential length of the corresponding annular induction coil 16a, 16b or 16c.

The widths of the slits 24 of the respective transmission units 19 are not necessarily adjusted based on the circumferential layout of the annular induction coil 16a (16b, 16c). The widths of the slits 24 of certain transmission units 19 may be randomly and individually adjusted to change the level of the high frequency power transmitted through the transmission units 19. In this way, the plasma density distribution in the chamber 11 can also be arbitrarily controlled.

For example, the supplied high frequency power is not stable near a start point and an end point (near A and C shown in FIG. 4A) of each of the annular induction coils 16a to 16c. Therefore, the plasma density distribution near the start point and the end point of each of the annular induction coils 16a to 16c is also not stable. At such a portion, the insertion member 23 having a diameter (insertable diameter) substantially the same as that of the through hole 22 is inserted into the through hole 22 such that the width of the slit 24 of the transmission unit 19 disposed at the corresponding portion becomes about 0 mm. Accordingly, the high frequency power cannot be transmitted through the transmission unit 19 disposed at the corresponding portion, and thus, the plasma is not generated near the start point and the end point of each of the annular induction coils 16a to 16c. Therefore, the plasma processing performed on the wafer W can be prevented from being adversely affected by a plasma having an unstable density near the start point and the end point of each of the annular induction coils 16a to 16c.

In accordance with the plasma processing apparatus 10 of the present embodiment, the plasma density distribution in the chamber 11 can be arbitrarily controlled by adjusting the widths of the slits 24 of the transmission units 19 as described above. Further, since the window member 14 is made of a conductor such as aluminum or the like, it is relatively inexpensive. Therefore, the increase in the cost of the window member 14, and further, the increase in the cost of the plasma processing apparatus 10 can be suppressed.

In the above-described plasma processing apparatus 10, the width of the slit (gap) 24 of each transmission unit 19 is adjusted by changing the diameter of the insertion member 23 inserted into the through hole 22. Accordingly, the level of the high frequency power supplied into the chamber 11 through the slits 24 can be simply changed.

In the above-described plasma processing apparatus 10, the O-ring 26 serving as an airtight sealing member is provided in each slit 24 that is a gap formed by inserting the insertion member 23 into the through hole 22, so that the width of the slit 24 can be uniformly maintained along the circumferential direction of the slit 24. Further, the lower dielectric ring 25 is disposed, in the slit 24, between the O-ring 26 and the inside of the chamber 11. Therefore, the plasma generated in the chamber 11 does not reach the O-ring 26, thereby preventing the O-ring 26 from being consumed in a short period of time by the plasma. Further, the width of each slit 24 may be uniformly maintained along the circumferential direction of the slit 24 by adjusting the inner diameter and the outer diameter of the lower dielectric ring 25 or the upper dielectric ring 27. The lower dielectric ring 25 or the upper dielectric ring 27 is preferably made of quartz, ceramic such as, alumina, aluminum nitride or the like, or a resin material, e.g., Teflon (Registered Trademark) or polyimide.

In the above-described plasma processing apparatus 10, each through hole 22 is formed in a cylindrical shape. However, as long as a plasma is uniformly generated in a processing chamber, the through hole 22 may have other shapes such as a square pillar shape, an elliptic columnar shape, a rectangular columnar shape, a diamond columnar shape, a curved columnar shape, a star-shaped columnar shape or the like. Further, the cross sectional shape of the through hole 22 may be changed along the thickness direction of the window member 14. In addition, the shape of the insertion member 23 inserted into the through hole 22 is also not limited to a cylindrical shape and may vary to other shapes such as an elliptic columnar shape, a rectangular columnar shape, a diamond columnar shape, a curved columnar shape, a star-shaped columnar shape or the like depending on the shape of the through hole 22.

Further the level of the high frequency power passing through each slit 24 is determined by the minimum width of the slit 24. Thus, the width of the slit 24 may not be uniform along the thickness direction of the window member 14 as long as the minimum width of the slit 24 is set to a desired value. In addition, the height of the insertion member 23 may not be equal to the depth of the through hole 22, and may be set to a value that enables the slit 24 to be formed between the insertion member 23 and the through hole 22 when the insertion member 23 is inserted into the through hole 22.

In the above-described plasma processing apparatus 10, the processing gas diffusion spaces 18 are separately arranged in the window member 14. However, the plasma processing apparatus may have a single processing gas diffusion space.

Figure 5:
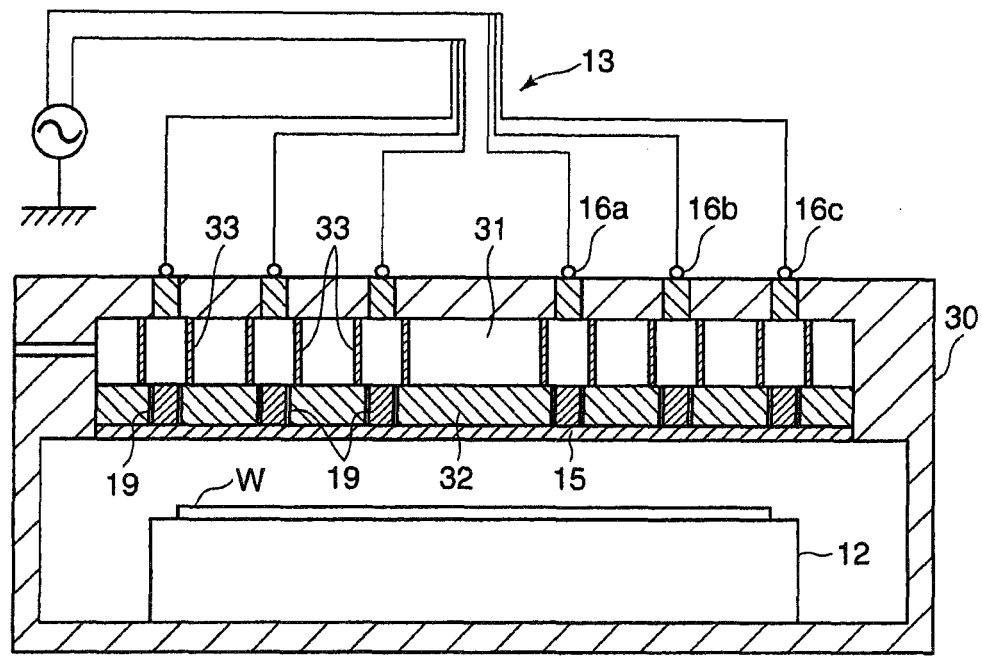
FIG. 5 is a cross sectional view schematically showing a configuration of a first modification of the plasma processing apparatus shown in FIGS. 1A and 1B.

For example, as shown in FIG. 5, a single flat plate-shaped processing gas diffusion space 31 may be formed at a ceiling portion of a chamber 30 of a plasma processing apparatus 29, and a window member 32 and the cover plate 15 may be provided in the chamber 30 to partition the processing gas diffusion space 31 and inside of the chamber 30. In this case, a plurality of waveguides 33 that are insulated cylindrical members are provided so as to correspond to each of the annular induction coils 16a to 16c so that the high frequency power applied by each of the annular induction coils 16a to 16c of the ICP antenna 13 can pass through the waveguides 33 and reach the transmission units 19 of the window member 32. Accordingly, the high frequency power does not make contact with the processing gas in the processing gas diffusion space 31, thereby preventing a plasma from being generated in the processing gas diffusion space 31. The plasma processing apparatus 29 has basically the same configuration as that of the plasma processing apparatus 10.

In the above-described plasma processing apparatus 10, the bottom surface of the window member 14 is covered by the cover plate 15. Therefore, the occurrence of abnormal discharge from the window member 14 toward the inside of the chamber 11 can be avoided, and the adhesion of reaction products generated by the plasma processing to the window member 14 can be prevented. The cover plate 15 may be made of a dielectric material such as quartz, ceramic or the like, a conductor such as a metal or the like, or a semiconductor such as silicon or the like. When the cover plate 15 is made of conductor, it is preferable to cover the surface of the cover plate 15 with an insulating coating film such as alumite, yttrium oxide or the like in order to avoid the occurrence of abnormal discharge due to the plasma in the chamber 11.

Figure 6:
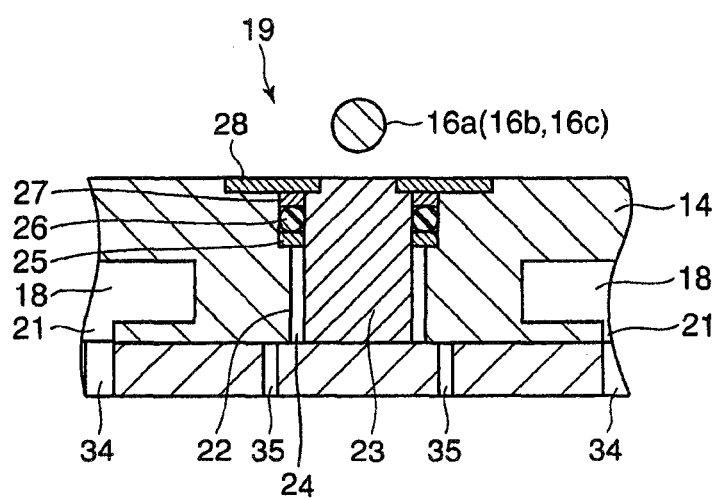
FIG. 6 is an enlarged cross sectional view schematically showing a configuration near the transmission unit in a second modification of the plasma processing apparatus shown in FIGS. 1A and 1B.

In the above-described plasma processing apparatus 10, the cover plate 15 has a plurality of processing gas supply holes 34 (see FIG. 3) extending therethrough in the thickness direction, and the processing gas supply holes 34 are arranged so as to respectively correspond to the processing gas supply holes 21. The cover plate 15 may further have slits 35 extending therethrough in a thickness direction, and the slits 35 are disposed so as to respectively correspond to the slits 24 (see FIG. 6). In this case, the high frequency power transmitted through the slits 24 positively passes through the slits 35 without passing through the cover plate 15. Therefore, the supply efficiency of the high frequency power into the chamber 11 can be improved. When the slits 35 are provided at the cover plate 15, it is preferable that the positions of the slits 35 are made not to be aligned with the positions of the slits 24 of the window member 14, respectively. Accordingly, the backflow of the plasma in the chamber 11 to the slits 24 through the slits 35 can be prevented. As a result, the occurrence of abnormal discharge in the slits 24 can be prevented.

Hereinafter, a plasma processing apparatus in accordance with a second embodiment of the present invention will be described.

The configurations and the operations of the plasma processing apparatus of the second embodiment are basically the same as those of the plasma processing apparatus 10 of the first embodiment. Therefore, the description on the same configurations and operations will be omitted, and different configurations and operations will be explained below.

Figure 7:
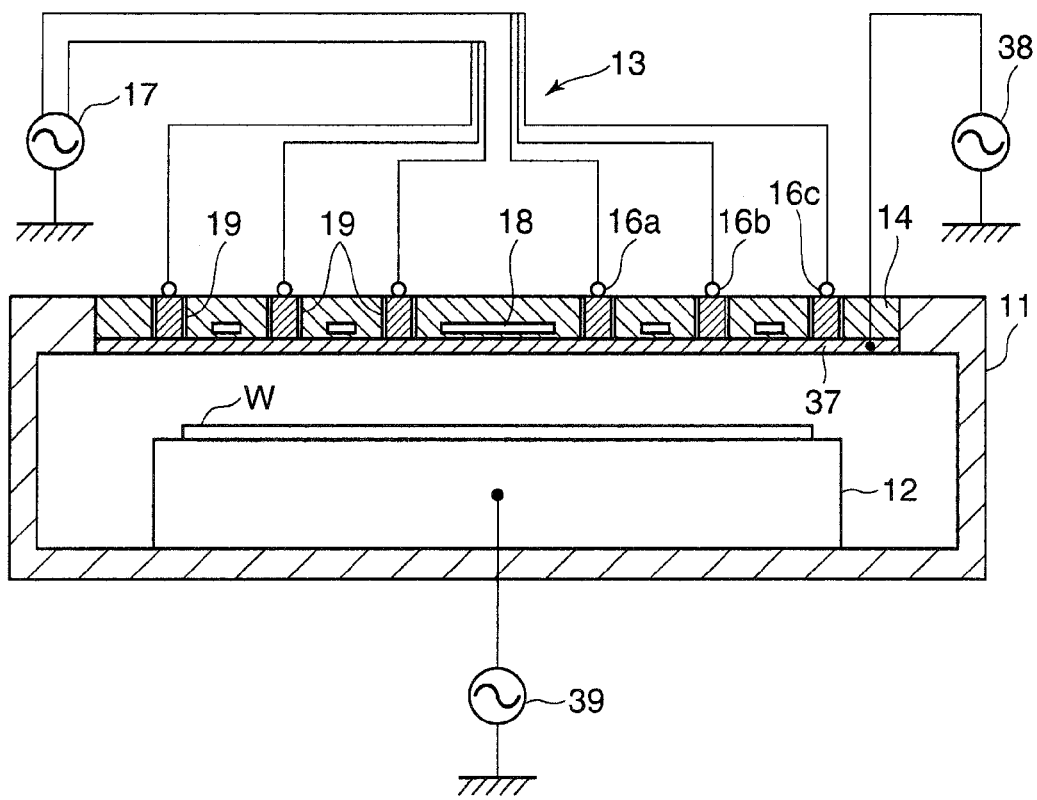
FIG. 7 is a cross sectional view schematically showing a configuration of a plasma processing apparatus in accordance with a second embodiment of the present invention.

FIG. 7 is a cross sectional view schematically showing a configuration of the plasma processing apparatus of the present embodiment.

Referring to FIG. 7, a plasma processing apparatus 36 includes a ceiling electrode plate 37 (covering plate-shaped member) for covering the bottom surface of the window member 14, a high frequency power supply 38 connected to the ceiling electrode plate 37, and a high frequency power supply 39 connected to the mounting table 12. The ceiling electrode plate 37 is disposed parallel to the top surface of the mounting table 12.

The mounting table 12 is made of a conductor, and the ceiling electrode plate 37 is made of a conductor or a semiconductor. The mounting table 12 and the ceiling electrode plate 37 constitute parallel plate electrodes. By supplying a high frequency power from the mounting table 12 and/or the ceiling electrode plate 37 to the inside of the chamber 11, the processing gas is excited, to thereby generate a plasma.

However, in the case of generating a plasma by using the parallel plate electrodes, if the frequency of the high frequency power supplied into the chamber 11 is high, the high frequency current generated by the high frequency power tends to be focused near the center of the mounting table 12. As a result, the plasma density in the region corresponding to the center of the wafer W in the chamber 11 (hereinafter, referred to as "central region") becomes higher than the plasma density in the region corresponding to the periphery of the wafer W in the chamber 11 (hereinafter, referred to as "peripheral region").

In the present embodiment, the plasma density distribution in the chamber 11 is made to be uniform by superposing the density distribution of the plasma, which is generated by the high frequency power supplied by the parallel plate electrodes, with the density distribution of the plasma, which is generated by the high frequency power through the window member 14.

Figure 8:
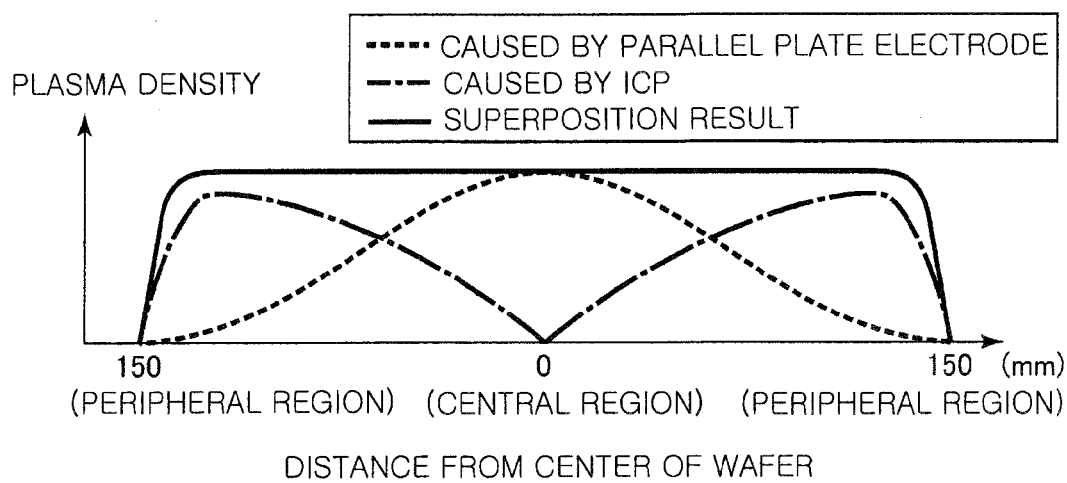
FIG. 8 explains a superposition of the distribution of the plasma density in the plasma processing apparatus shown in FIG. 7.

FIG. 8 explains the superposition of the distribution of the plasma density in the plasma processing apparatus 36 shown in FIG. 7.

Referring to FIG. 8, in the plasma processing apparatus 36, the density of the plasma generated in the chamber 11 by the high frequency power supplied by the parallel plate electrodes (hereinafter, referred to as "plasma caused by the parallel plate electrodes") is higher in the central region and lower in the peripheral region (indicated by a dashed line in FIG. 8).

Meanwhile, in the window member 14, the widths of the slits 24 of the transmission units 19 corresponding to the central region are made to be decreased while the widths of the slits 24 corresponding to the peripheral region are made to be increased. As a consequence, the density of the plasma, which is generated in the chamber 11 by the high frequency power applied by each of the annular induction coils 16a to 16c of the ICP antenna 13 (hereinafter, referred to as "plasma caused by the ICP antenna"), is lower in the central region and higher in the peripheral region (indicated by a dashed-dotted line in FIG. 8). As a result, the uniform plasma density distribution (indicated by a solid line in FIG. 8) can be obtained in the chamber 11 by superposing the density distribution of the plasma caused by the parallel plate electrodes and the density distribution of the plasma caused by the ICP antenna.

In other words, in accordance with the plasma processing apparatus 36 of the present embodiment, the widths of the slits 24 of the transmission units 19 corresponding to the regions where the density is low in the density distribution of the plasma caused by the parallel plate electrodes are made to be increased while the widths of the slits 24 of the transmission units 19 corresponding to the region where the density is high in the density distribution of the plasma caused by the parallel plate electrodes are made to be decreased. Therefore, the plasma caused by the ICP antenna is generated to make up for the non-uniformity in the density distribution of the plasma caused by the parallel plate electrodes. As a result, the uniform plasma density distribution can be obtained in the chamber 11.

In the the plasma processing apparatus 36, the ceiling electrode plate 37 is preferably made of a semiconductor silicon. Since, however, the resistivity of silicon has a temperature dependency, it is preferable to maintain the temperature of the ceiling electrode plate 37 at a constant range. Specifically, the resistivity of silicon is relatively constantly maintained in a range from about 200° C. to 300° C., so that the temperature of the ceiling electrode plate 37 is preferably maintained in a range from about 200° C. to 300° C. In order to maintain the temperature of the ceiling electrode plate 37 in a range from about 200° C. to 300° C., the plasma processing apparatus 36 may have a temperature control unit for controlling a temperature of the ceiling electrode plate 37. As for the temperature control unit, although not shown, it is possible to use, e.g., a resistance heater, a lamp heater, an electromagnetic heater provided at the ceiling portion of the chamber 11, or a circulating path of a heating medium (gas or liquid) embedded in the ceiling portion of the chamber 11.

Figure 9A:
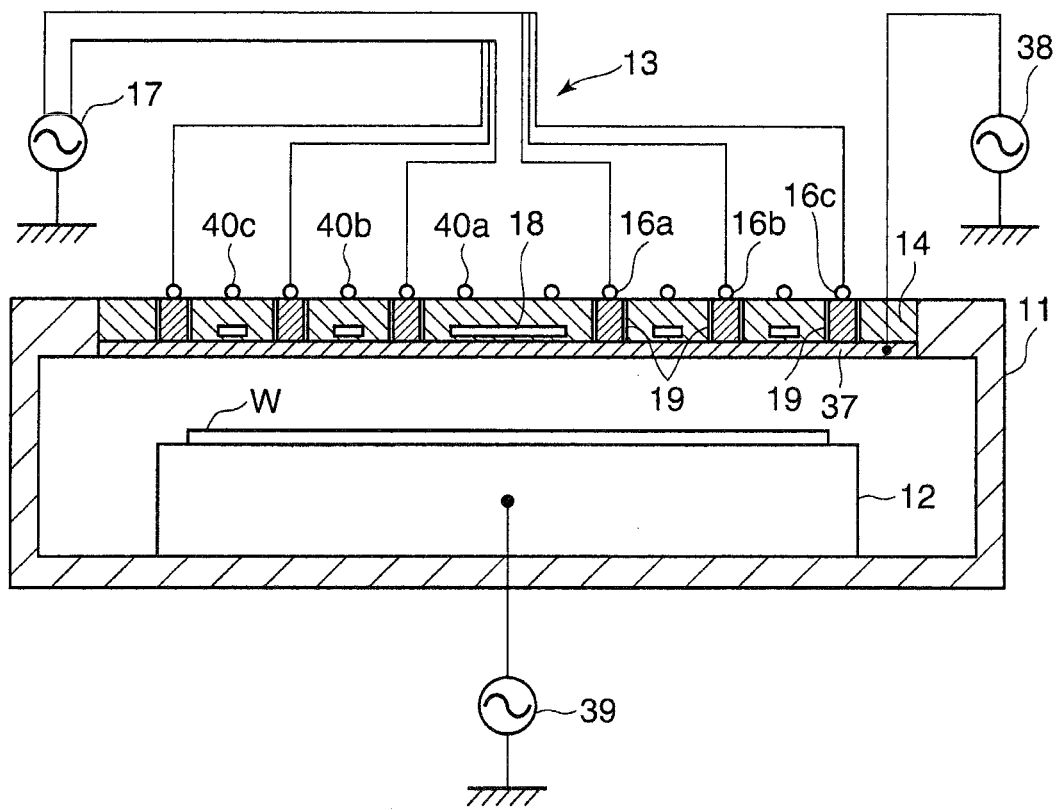
Figure 9B:
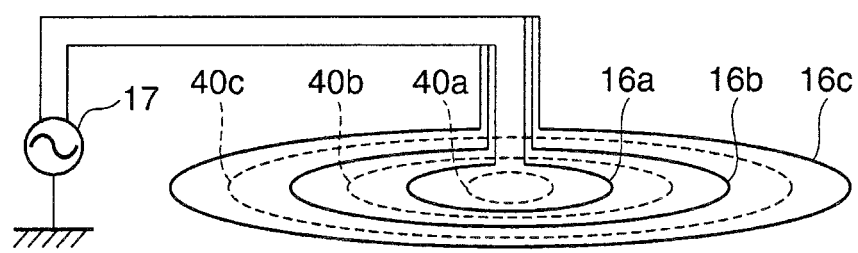

In the plasma processing apparatus 36, not all the high frequency powers applied from the annular induction coils 16a to 16c pass through the transmission units 19, so that a residual high frequency power is generated near each of the annular induction coils 16a to 16c. In order to absorb the residual high frequency power, absorption coils 40a to 40c that are ring-shaped conductors may be provided between the annular induction coils 16a to 16c, as shown in FIGS. 9A and 9B. Specifically, the absorption coil 40a is provided at the inner side of the annular induction coil 16a; the absorption coil 40b is provided between the annular induction coil 16a and the annular induction coil 16b; and the absorption coil 40c is provided between the annular induction coil 16b and the annular induction coil 16c. The annular induction coils 16a to 16c and the absorption coils 40a to 40c are arranged in concentric circular patterns. In FIG. 9B, the absorption coils 40a to 40c are indicated by dashed lines.

The absorption coils 40a to 40c form closed loops without being connected to the high frequency power supply or the like. Therefore, each of the absorption coils 40a to 40c absorbs the residual high frequency and generates a high frequency current therein. The generated high frequency current is consumed by the inner resistance of each of the absorption coils 40a to 40c and turned into heat. Accordingly, the absorption coils 40a to 40c generate heat, which makes it possible to maintain the temperature of the ceiling electrode plate 37 at a high temperature, e.g., in a range from about 200° C. to 300° C.

Although the present invention has been described with the aforementioned embodiments, the present invention is not limited to the aforementioned embodiments.

For example, in the above embodiments, the ICP antenna 13 is used as the plasma generation source. However, the plasma generation source is not limited thereto, and a microwave radiation antenna, e.g., a radial line slot antenna may also be used.

Figure 10:
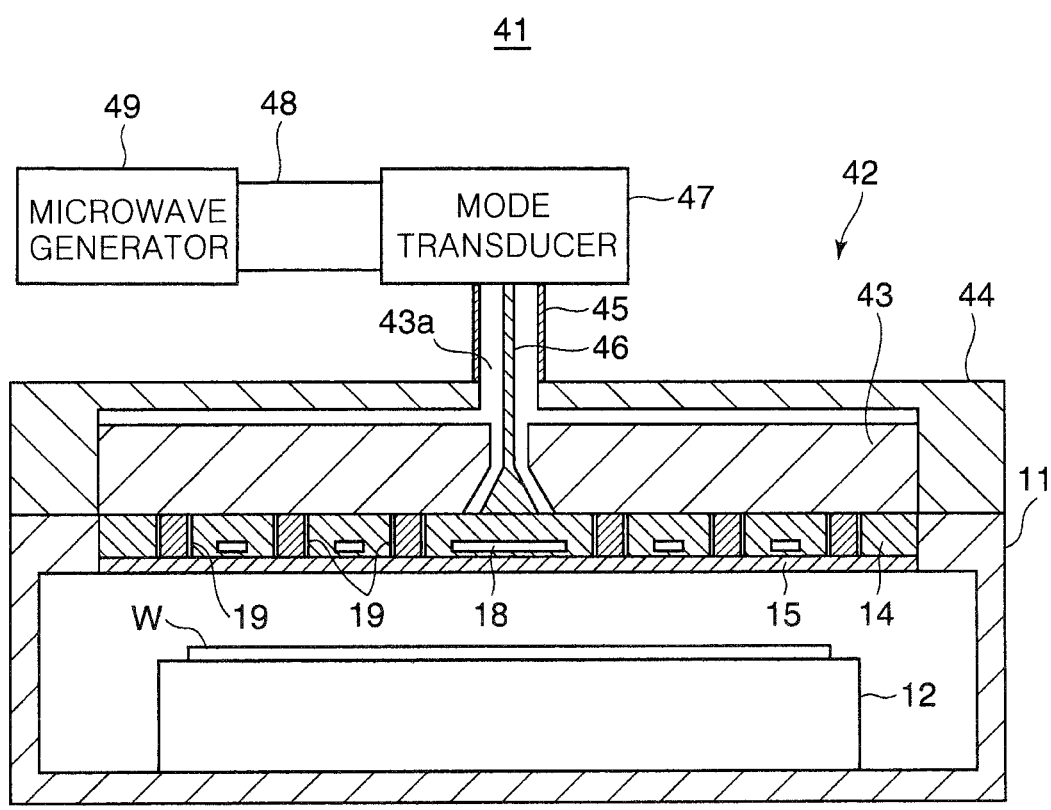
FIG. 10 is a cross sectional view schematically showing a configuration of a plasma processing apparatus using an RLSA as a plasma generation source.
Figure 11:
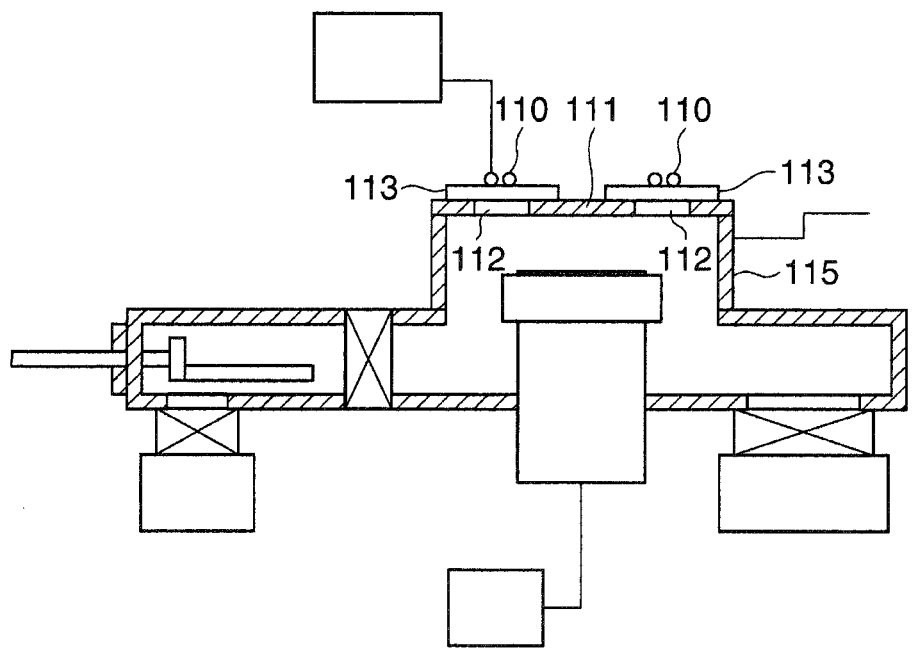
FIG. 11 is a cross sectional view schematically showing a configuration of a conventional plasma processing apparatus.
Figure 12:
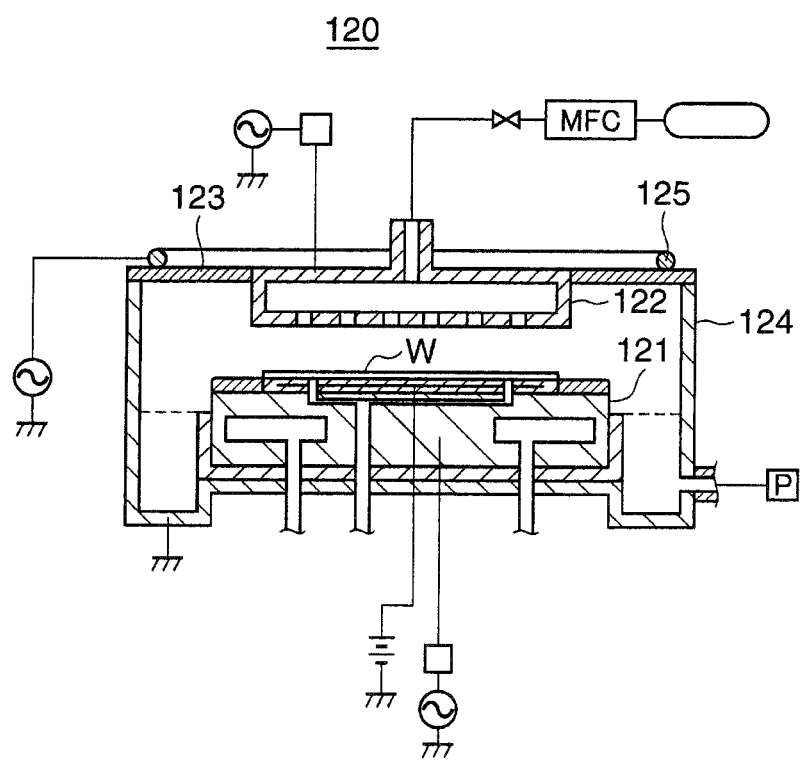
FIG. 12 is a cross sectional view schematically showing a configuration of another conventional plasma processing apparatus.

FIG. 10 is a cross sectional view schematically showing a configuration of a plasma processing apparatus 41 using a radial line slot antenna as a plasma generation source. In the plasma processing apparatus 41, the window member 14 is used as the radial line slot antenna. Further, the configurations and the operations of the plasma processing apparatus 41 are basically the same as those of the plasma processing apparatus 10 of the first embodiment. Therefore, the description on the same configurations and operations will be omitted, and different configurations and operations will be explained below.

Referring to FIG. 10, the plasma processing apparatus 41 includes a microwave applied device 42 disposed outside the chamber 11 opposite to the mounting table 12 in the chamber 11.

The microwave applied device 42 includes: the window member 14 serving as the radial line slot antenna; a wave retardation plate 43, made of a dielectric material, disposed on the window member 14; and a waveguide box 44 that is a conductive hollow cylindrical container disposed on the chamber 11. The waveguide box 44 accommodates the wave retardation plate 43 so as to cover the wave retardation plate 43, and the window member 14 serves as a bottom plate for the waveguide box 44.

In the microwave applied device 42, a coaxial waveguide 45 including an outer conductor and an inner conductor 46 is connected to an upper central portion of the waveguide box 44. The inner conductor 46 such as a cable or the like which is provided inside the coaxial waveguide (outer conductor) 45 is connected to a central portion of the window member 14 via a central through hole 43a of the wave retardation plate 43. A microwave generator 49 for generating a microwave of about 2.45 GHz is connected to one end of the coaxial waveguide 45 via a mode transducer 47 and a rectangular waveguide 48 and transmits a microwave to the window member 14. The frequency of the microwave generated by the microwave generator 49 is not limited to about 2.45 GHz, and may be another frequency, e.g., about 8.35 GHz. In order to shorten the wavelength of the microwave, a member made of a high-k dielectric material is used as the wave retardation plate 43. For example, a member made of, e.g., resin, quartz or ceramic such as aluminum nitride or the like is used to shorten the wavelength of the microwave.

In the window member 14, the microwave transmitted from the microwave generator 49 is supplied into the chamber 11 through the slits 24 of each transmission unit 19. The microwave supplied into the chamber 11 excites the processing gas, thereby generating a plasma.

In the plasma processing apparatus 41 as well, the intensity of the microwave supplied into the chamber 11 via each slit 24 can be changed by adjusting the width of the slit 24 of each transmission unit 19 described in the above embodiments. Therefore, it becomes possible to control the plasma density in the regions corresponding to the transmission units 19. Hence, the plasma density in the chamber 11 can be arbitrarily controlled.

As a consequence, a plasma can be uniformly generated in the chamber.

What is claimed is:

1. A plasma processing apparatus comprising:
   a processing chamber configured to accommodate a substrate;
   a mounting table provided in the processing chamber and configured to mount thereon the substrate;
   an applied antenna provided outside the processing chamber opposite to the mounting table and configured to supply a high frequency power or a microwave into the processing chamber for a generation of plasma in the processing chamber;
   a window member made of an electrical conductor, which forms a part of a wall of the processing chamber and is disposed between the mounting table and the applied antenna; and
   a cover plate covering a bottom surface of the window member which faces an inside of the processing chamber,
   wherein the window member includes transmission units, and each transmission unit includes a slit extending into the window member in a thickness direction thereof and a width adjustment mechanism configured to adjust a width of the slit,
   wherein the width adjustment mechanism includes a through hole extending through the window member in the thickness direction thereof and an insertion member made of an electrical conductor and inserted into the through hole,
   wherein the insertion member is a cylindrical member and is in contact with the cover plate,
   wherein each transmission unit is configured to transmit the high frequency power or the microwave in the thickness direction of the window member through the slit, and
   wherein the slit is formed as a gap between the through hole and the insertion member and the width of the slit is configured to be adjusted by changing the size of the insertion member, so that an amount of the high frequency power or the microwave transmitted through the slit is adjusted and a uniformity of the plasma is adjusted thereby.

2. The plasma processing apparatus of claim 1, wherein the applied antenna has a ring-shaped coil connected to a high frequency power supply and the transmission units are disposed along the ring-shaped coil.

3. The plasma processing apparatus of claim 1, wherein a sealing member is provided in the slit, and the sealing member is configured to airtightly isolate the inside of the processing chamber from an outside of the processing chamber, and wherein the high frequency power or the microwave is supplied into the processing chamber through the sealing member.

4. The plasma processing apparatus of claim 3, wherein the through hole is a cylindrical hole; the sealing member is an O-ring; and a ring-shaped dielectric member is provided in the slit between the O-ring and the inside of the processing chamber to protect the sealing member from the plasma.

5. The plasma processing apparatus of claim 4, wherein an annular dielectric member is provided in the slit between the sealing member and the applied antenna and a total thickness of the ring-shaped dielectric member, the sealing member and the annular dielectric member in the thickness direction of the window member is smaller than a thickness of the window member in the thickness direction of the window member.

6. The plasma processing apparatus of claim 1, wherein a high frequency power supply is connected to the mounting table; the cover plate serves as an electrode plate made of a conductor or a semiconductor; and the mounting table and the electrode plate constitute parallel plate electrodes.

7. The plasma processing apparatus of claim 1, wherein the cover plate has a plurality of different slits extending therethrough in a thickness direction of the cover plate.

8. The plasma processing apparatus of claim 7, wherein positions of slits of the transmission units formed in the window member are arranged not to be aligned with positions of the different slits formed in the cover plate.

9. The plasma processing apparatus of claim 1, wherein the applied antenna is disposed directly above the window member with an empty space therebetween.

10. The plasma processing apparatus of claim 1, wherein the slits of the transmission units can be varied to have different sizes.

11. The plasma processing apparatus of claim 1, wherein one or more processing gas diffusion spaces are formed inside the window member and one or more processing gas supply holes are formed on the bottom surface of the window member and communicating with the one or more of the processing gas diffusion spaces, wherein each transmission unit is separated from each processing gas diffusion space and processing gas supply hole.

12. The plasma processing apparatus of claim 11, wherein the processing gas diffusion spaces are formed in concentric circular patterns along the window member.

13. The plasma processing apparatus of claim 12, wherein transmission units are divided into an inner transmission unit group, an intermediate transmission unit group, and an outer transmission unit group, and the inner transmission unit group, the intermediate transmission unit group, and the outer transmission unit group are arranged in concentric circular patterns with the gas diffusion spaces along the window member.

* * * * *